United States Patent
Peng et al.

(10) Patent No.: US 6,251,794 B1
(45) Date of Patent: *Jun. 26, 2001

(54) METHOD AND APPARATUS WITH HEAT TREATMENT FOR STRIPPING PHOTORESIST TO ELIMINATE POST-STRIP PHOTORESIST EXTRUSION DEFECTS

(75) Inventors: Chiang-Jen Peng, Shin-Chu County; Ching-Chung Lin, Taipei, both of (TW)

(73) Assignee: Taiwan Semiconductor Manufacturing Company, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/252,627

(22) Filed: Feb. 18, 1999

(51) Int. Cl.⁷ .................................................. H01L 21/302
(52) U.S. Cl. ........................ 438/712; 438/714; 438/715; 438/725; 438/745
(58) Field of Search ........................................ 438/706, 710, 438/715, 725, 745, 750, 754, 714, 712

(56) References Cited

U.S. PATENT DOCUMENTS

| | | | |
|---|---|---|---|
| 5,037,506 | * 8/1991 | Gupta et al. | 438/706 |
| 5,066,843 | 11/1991 | Revesz | 219/10.55 R |
| 5,226,056 | 7/1993 | Kikuchi et al. | 373/18 |
| 5,262,279 | * 11/1993 | Tsang et al. | 430/311 |
| 5,336,625 | * 8/1994 | Tong | 438/234 |
| 5,340,775 | * 8/1994 | Carruthers et al. | 438/601 |
| 5,702,869 | 12/1997 | Chien et al. | 430/313 |
| 5,731,243 | * 3/1998 | Peng et al. | 438/612 |
| 5,733,821 | 3/1998 | Nishikawa | 438/727 |
| 5,744,402 | 4/1998 | Fukazawa et al. | 438/734 |
| 5,780,406 | * 7/1998 | Honda et al. | 510/175 |
| 5,807,787 | 9/1998 | Fu et al. | 438/623 |
| 5,902,134 | * 5/1999 | Egashira | 438/723 |
| 5,939,241 | * 8/1999 | Leu et al. | 430/318 |
| 6,006,764 | * 12/1999 | Chu et al. | 134/1.2 |

* cited by examiner

Primary Examiner—Benjamin L. Utech
Assistant Examiner—Binh X. Tran
(74) Attorney, Agent, or Firm—George O. Saile; Stephen B. Ackerma

(57) ABSTRACT

A method for removing a photoresist layer from a semiconductor substrate following a conventional dry etching step. A first wet chemical treatment strips the photoresist. A second dry ash with oxygen plasma completes the photoresist removal. To assure complete removal of photoresist imbedded on or within the material underlying the photoresist film, the semiconductor substrate is preheat treated to a temperature in the range of 150 to 250 degrees Centigrade to release the photoresist prior to the second dry ash with oxygen plasma operation. In particular, this method eliminates photoresist extrusion defects from occurring during a bond pad alloy operation.

9 Claims, 7 Drawing Sheets

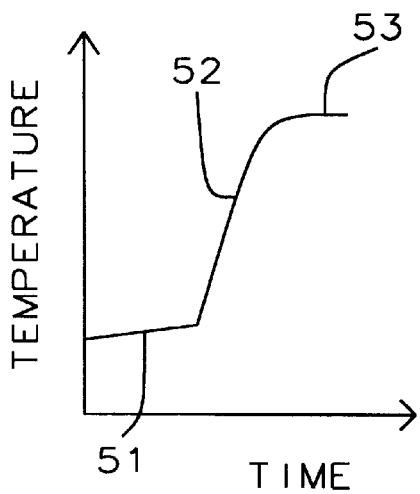
FIG. 5
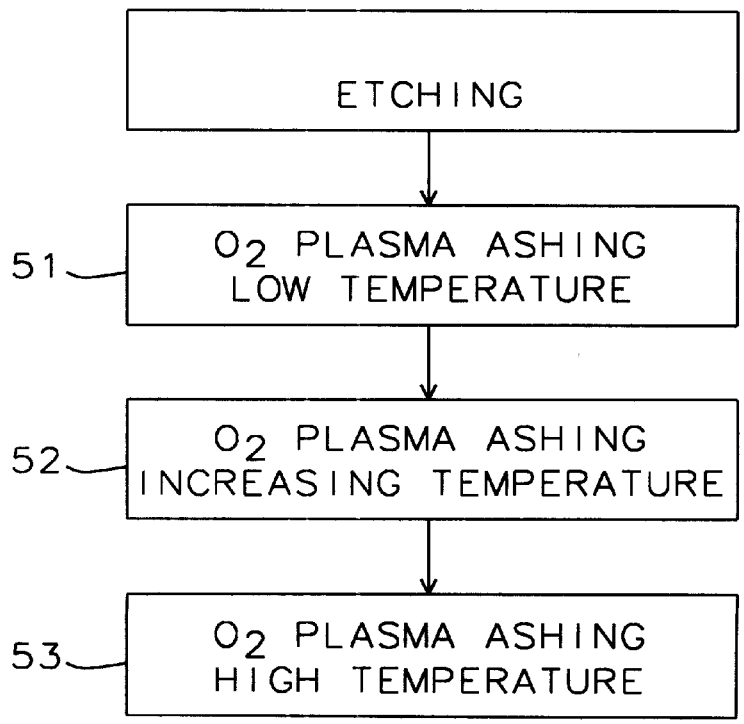
FIG. 6 - Prior Art

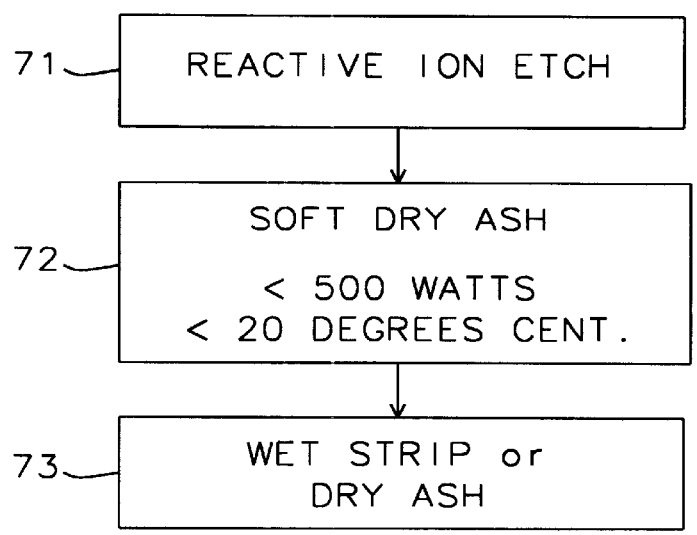
FIG. 7 – Prior Art
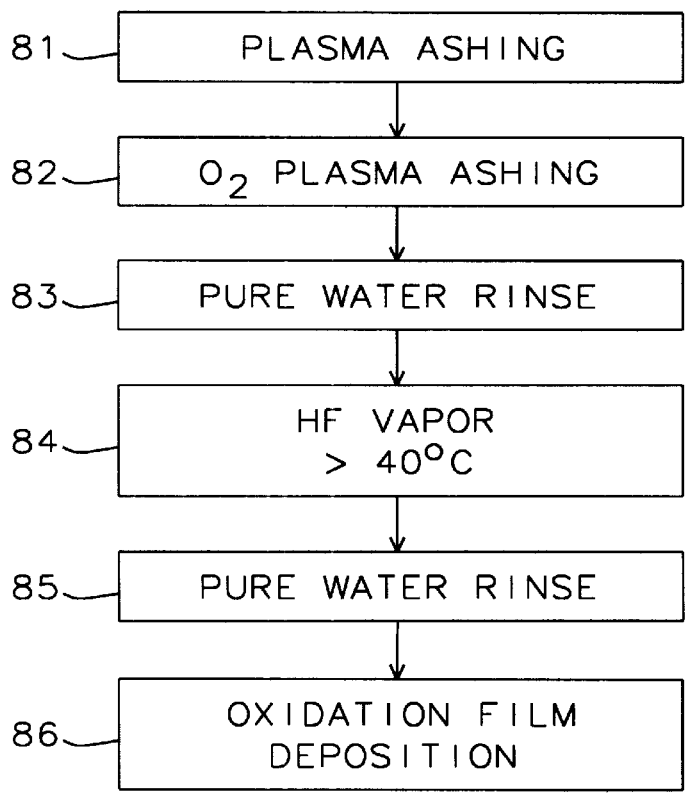
FIG. 8 – Prior Art

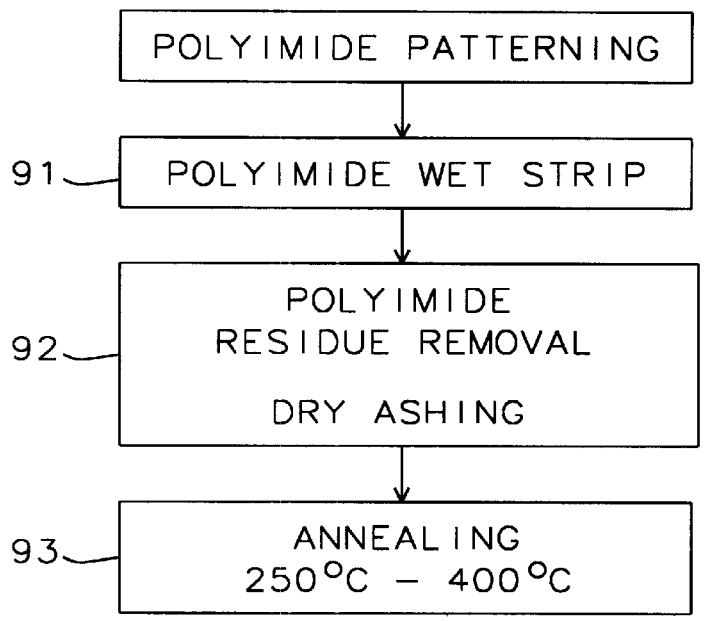
FIG. 9 - Prior Art
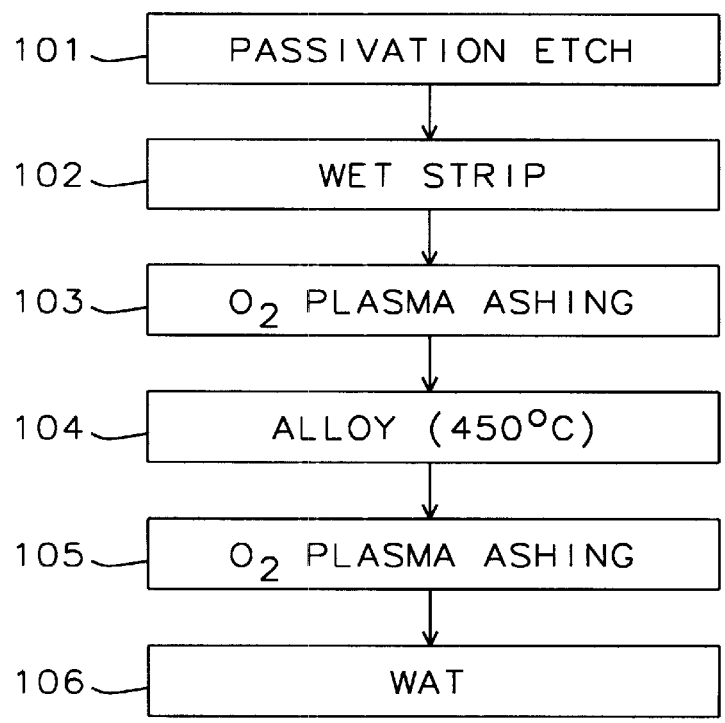
FIG. 10

METHOD AND APPARATUS WITH HEAT TREATMENT FOR STRIPPING PHOTORESIST TO ELIMINATE POST-STRIP PHOTORESIST EXTRUSION DEFECTS

FIELD OF THE INVENTION

The invention relates to the fabrication of integrated circuit devices, and more particularly to a method and an apparatus for eliminating of photoresist extrusions (photoresist bubbles) formed in the post dry ash bond pad alloy operation.

DESCRIPTION OF THE PRIOR ART

Integrated Circuit Manufacture

Integrated circuits are formed upon semiconductor substrates from semiconductor devices, such as field effect transistors (FETs) and/or bipolar transistors, diodes, resistors as well as other electrical devices which are typically electrically interconnected using multiple layers (usually two to four) of patterned conductor materials, such as metal, refractory metal silicides and doped polysilicon.

Each layer of patterned conductor is separated by a layer of insulating material such as silicon oxide ($SiO_2$) typically deposited by chemical vapor deposition (CVD) methods, over each patterned conductor to insulate it from the next layer of patterned conductor.

Via holes in each layer of the insulating material are patterned by etching methods to expose portions of the electrical devices and/or the prior patterned conductor to the next layer of patterned conductor. In this manner all layers of patterned conductor are interconnected to form the required wired circuits and function of the integrated circuit.

Using the FIG. 2 as an example, a final layer of conducting material, typically composed of an aluminum or an aluminum/copper alloy on a substrate 1 (the underlying layers not shown) suitable for bonding external wiring, is patterned in a standard array of bond pads 2 for subsequent connection to the signal inputs and outputs (IOs) and the electrical power and ground sources on a single or a multiple chip carrier.

The substrate, made of semiconductor material, with the internal devices, multi-level of interconnection wiring and the array of bond pads is passivated, to insulate the final layer of conducting material and to physically protect the integrated circuit.

In a conventional method, FIG. 10, a first layer of passivation 3 is typically formed by chemical vapor deposition (CVD) of an blanket insulating material, which is patterned etched 101 to form contact openings 4 exposing the bond pads 2.

The next major operation upon the substrate in the integrated circuit manufacturing process is an alloy step 104 which is typically performed upon the array of bond pads to assure low contact resistance with the bond pads.

The present invention in particular, hereinafter discussed, addresses the photoresist removal operations prior to the alloy operation 104 to eliminate a defect 5.

A second, thicker passivation layer 6, shown within the dotted lines in FIG. 2, usually a photosensitive polyimide, is then applied to the substrate to provide additional insulation and physical protection for the integrated circuits as the substrate is subsequently tested, diced into individual chips, the chips mounted in chip carriers and the bond pads connected to chip carrier I/Os.

Photoresist Operations

Throughout the semiconductor manufacturing process photolithographic operations are called upon to realize the semiconductor device structures and their multilevel interconnections from photomask images through the use of a photoresist medium 7 which is patterned 8 as exemplified in FIG. 1.

The patterned photoresist 8, shown in FIG. 1, performs the task of protecting the underlying material from reaction to the subsequent process, such as etching of conductor or insulator materials and ionization doping of semiconductor materials.

Photoresists in liquid form are usually spin coated on the semiconductor substrate and are prepared for the photolithographic operation. The photoresist is exposed with a certain wavelength of light to an image on the photomask, typically in a step and repeat align and expose apparatus. Exposure of the photoresist to this image pattern hardens the resist into the desired latent pattern. A photoresist developing process, typically a wet chemical treatment, removes the unhardened resist leaving a pattern of resist protecting the underlying material for the subsequent major manufacturing process step. Photolithographic operations include the use of positive and negative photomasks, positive and negative photoresists, projection and contact printing with a range of exposure wavelengths and a variety of photoresist developing processes.

Typically, this patterned photoresist 8 is then removed by a wet chemical treatment 102 and/or oxygen plasma dry ash 103 to present a fully patterned underlying layer of conductor, semiconductor or insulation material.

Manufacturing Defects

Defects occur at any of the processing steps in the manufacture of a semiconductor integrated circuit and are characterized as to where, when and how they occurred, such as pin holes in a blanket insulation layer, defect in a photomask, or contamination in the wet treatment chemicals, and as to whether they are fatal, repairable or cosmetic defects.

Usually, after one or more semiconductor manufacturing steps a quality control inspection, a staged inspection or an in process inspection is undertaken to reveal defects attributable to the prior processes, to assure maintaining manufacturing process tolerances, to rework or to scrap the substrate and to assure quality of the integrated circuit. Discovery of a defect by inspection and proposed theory of their generation give rise to instituting new methods of process to preclude future generation of the defect.

Refer to FIG. 2. The particular defect remedied by the present invention is a photoresist extrusion 5 or photoresist bubble caused by incomplete removal 102 and 103 of photoresist after the passivation layer etching step. Again refer to FIG. 1. The first passivation layer 3 is typically 7000–12000 Angstroms thick and it follows the topography of the underlying metal conductor patterns 2 and 9, which is typically 4000–8000 Angstroms thick, giving rise to passivation keyholes 10, in the overlying passivation layer entrapping photoresist material 5 which is not removed during the photoresist removal steps of wet stripping 102 and dry ashing with oxygen plasma 103. The defect is not observable after the oxygen plasma dry ash 103, but can be observed after the alloy step 104. The defect is theorized to be due to the photoresist residue extruding from the keyholes 10 due to the subsequent alloy step 104 performed at 450 degrees Centigrade. The conventional remedy for the removal of this post alloy extruded photoresist residue is to subject the substrate to a second oxygen plasma ash step 105.

The keyholes 10, as illustrated in proportional cross-sectional detail in FIG. 13 are small cavities generated in the passivation layer 3 as it is continually deposited in regions of close metal conductor 9 spacing. The passivation layer 3 growth is not uniform within a narrow gap between metal conductor features 9 and the resulting cavity extending to the passivation layer 3 surface is formed parallel to the metal conductors 9. When photoresist is applied to the surface, it penetrates into these keyholes 10, yet neither wet stripping nor dry ashing is effective in completely removing the photoresist prior to alloy step 104.

In general this type of defect, imbedded photoresist, may be found relative to other types of defects in any of the interconnecting insulator or conductor layers, namely pinholes or small voids in the blanket insulating or conductor material in which is imbedded some of the overlying patterned photoresist.

Specific Prior Art

The following prior art, presented chronologically, discusses the utilization of different wet chemical treatment, dry ash and substrate heating techniques employed in methods of photoresist removal to eliminate other specific defects or problems.

Refer to FIGS. 5 and 6. U.S. Pat. No. 5,226,056 (1993 Kikuchi et al.) addresses the need to use patterned photoresist materials directly, early in the manufacturing process, for forming the semiconductor electrical devices by impurity doping ionization techniques, the resulting surface hardening of the photoresist by the ionization process, the problem associated with removal of surface hardened photoresist and, discloses a method and apparatus for the removal of the photoresist. Conventional dry ashing a heated substrate with oxygen plasma can cause the surface hardened photoresist to explode, generating undesirable contamination. The method includes a dual mode of resist removal which requires a low initial temperature 51 of the semiconductor substrate while oxygen plasma ashing the hardened outer surface, then raising the temperature 52 and 53 for conventional ashing of the remainder of the resist material. The substrate is heated by either an infrared lamp or by contact with a hotplate. After the initial oxygen plasma operation to remove the hardened photoresist, the infrared lamp is turned on or respectively the substrate is lowered into contact with the hotplate. There is also disclosed an apparatus provided for hard and soft ashing and a means for uniform dispersal of gases. This method does not utilize a wet process for photoresist removal.

For U.S. Pat. No. 5,702,869 (1997 Chien et al.), refer to FIGS. 3 and 7. Here is disclosed a soft ashing method for removing the partially fluorinated layers 35 of photoresist and metal-polymer residues 36 during the removal of photoresist from a substrate 31 depicted with a patterned conductor 32 and a patterned insulator 33. Photoresist fluorinated layers 35 occur as the result of Reactive Ion Etching (RIE) 71 with RIE etchants containing fluorine which react with the insulator materials formed of silicon to form volatile gases which are easily removed. High power ashing operations upon the partially fluorinated photoresist layer 35 often cause damage to the adjoining photoresist layer 34 and generates a difficult to remove metal polymer residue 36. This soft ash method basically limits the oxygen plasma power to no more than 500 Watts while the substrate temperature is limited to 20 degrees Centigrade while removing 72 the partially fluorinated layer of the photoresist 35, and the remaining non-fluorinated layer of the photoresist 34 is removed by either a dry ash treatment or a wet strip treatment 73.

U.S. Pat. No. 5,733,821 (1998 Nishikawa) discloses a process for fabricating semiconductor devices and an ashing apparatus utilizing microwave and radio frequency energy for generating oxygen plasma.

U.S. Pat. No. 5,744,402 (1998 Fukuzawa et al.) discloses a method, illustrated in FIGS. 4A, 4B and 8, as applied to a sequential patterning of conductor layers 41 and the corresponding interconnect vias 42 on a substrate 44, to remove a photoresist after dry etching 81 with a halogen series gas which includes an oxygen plasma photoresist removal dry ash step 82 followed by a pure water rinse 83, a HF vapor exposure 84 at 40 degrees Centigrade or higher, and a second rinse 85, all within an integrated set of vacuum chambers without contact to air. This method assures that the reaction product, a polymer 43, generated in the etching process is also removed. Conventional removal of the polymer 43 generally employs washing the surface with an amine series organic solvent followed by isopropyl alcohol and water.

In U.S. Pat. No. 5,807,787 (1998 Fu et al.) is disclosed a method for reducing surface leakage current resulting from a second passivation layer operation in which a thick layer of polyimide is patterned over the bond pads. Refer to FIG. 2 as an example and to FIG. 9. The photosensitive polyimide 6 (dotted lines) is patterned by masking techniques and crosslinked by exposure to UV radiation. Removal of the unexposed polyimide is typically accomplished with a wet process 91 but leaves a residue scum on the bond pads 2 which is subsequently removed in descumming mild dry ash operation 92 which can adversely affect the first passivation layer insulation 3 properties by raising its conductance. A subsequent thermal annealing 93 of the substrate on a hotplate at 250–400 degrees Centigrade for 3 minutes in air or nitrogen restores and improves the insulation properties.

In semiconductor manufacturing, vacuum processing operations such as reactive ion etching (RIE) and oxygen plasma dry ash, are typically conducted in a load lock integrated modular multiple chamber vacuum processing system as exemplified by the system illustrated in FIG. 14.

SUMMARY OF THE INVENTION

The principal object of the present invention is to provide a method for the complete removal of a photoresist after a first passivation layer etching to eliminate photoresist residue imbedded within the surface of the passivation layer prior to coating the substrate with a second passivation layer.

A second objective of the present invention is to preclude the emergence of a defect caused by the extrusion of photoresist residue during a high temperature bond pad alloy step.

It is a further object of the present invention to is to eliminate a dry ash step necessary to remove the extruded photoresist after the high temperature alloy operation.

Another object of the present invention is to provide the same method for the complete removal of a photoresist after the operation of etching an insulating layer other than the first passivation layer.

A further object of the present invention is to provide the same method for the complete removal of a photoresist after the operation of etching a patterned conductor layer.

Still another object of the present invention is to define an in-situ heating device within a dry ash chamber for the purpose of extruding the photoresist residue prior to a dry ash step.

Yet another object of the present invention is to define a heating device within an integrated modular multiple chamber vacuum processing system (IMMCVPS) for the purpose of extruding the photoresist residue prior to a dry ash step.

The present invention is a method which is employed after an etching operation and employs a thermal treatment step after a patterned photoresist wet stripping step to cause any photoresist residue remaining in the keyhole on a substrate to be extruded. The method further includes a step of dry ash to remove the extruded photoresist residue together with other photoresist residues and byproducts of the etching and wet stripping operations.

DESCRIPTION OF THE DRAWINGS

In the accompanying drawings forming a material part of this description, there is shown:

FIG. 5 is a graph relating the application of heat to a substrate over a period of time while the substrate is subject to an oxygen plasma dry ash operation.

FIG. 6 is a flowchart of a prior art method of photoresist removal.

FIG. 7 is a flowchart of a prior art method of photoresist removal.

FIG. 8 is a flowchart of a prior art method of photoresist removal.

FIG. 9 is a flowchart of a prior art method of heat treating a substrate following polyimide removal.

FIG. 10 is a flowchart of a method of conventional photoresist removal before and after the bond pad alloy operation.

DESCRIPTION OF THE PREFERRED EMBODIMENTS

Four embodiments of the invention are presented; the first being a method of manufacture specifically directed to photoresist removal at the passivation layer; the second embodiment being an apparatus configuration for preheat treating a substrate; the third embodiment being another apparatus configuration for preheat treating a substrate and the fourth embodiment being generally applicable to photoresist removal during manufacture at the underlying semiconductor and interconnect layers.

First Embodiment

Figure 1:
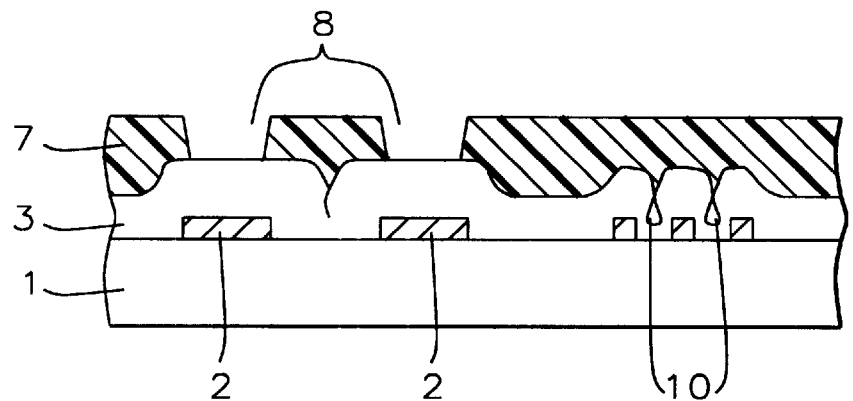
FIG. 1 is a cross-sectional view of a semiconductor substrate depicting the final bond pad layer with a first passivation layer with an overlay of patterned photoresist.
Figure 2:
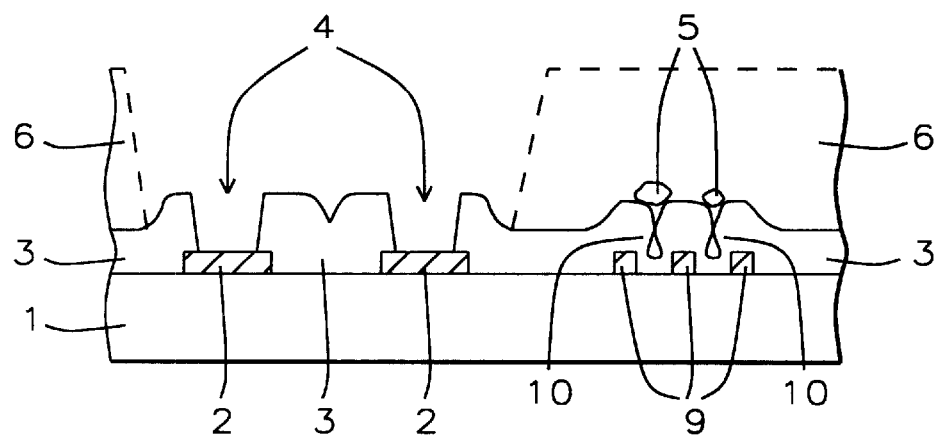
FIG. 2 is a cross sectional view of a substrate depicting contact holes in the first passivation layer and the location of the subsequent second layer of passivation.
Figure 3:
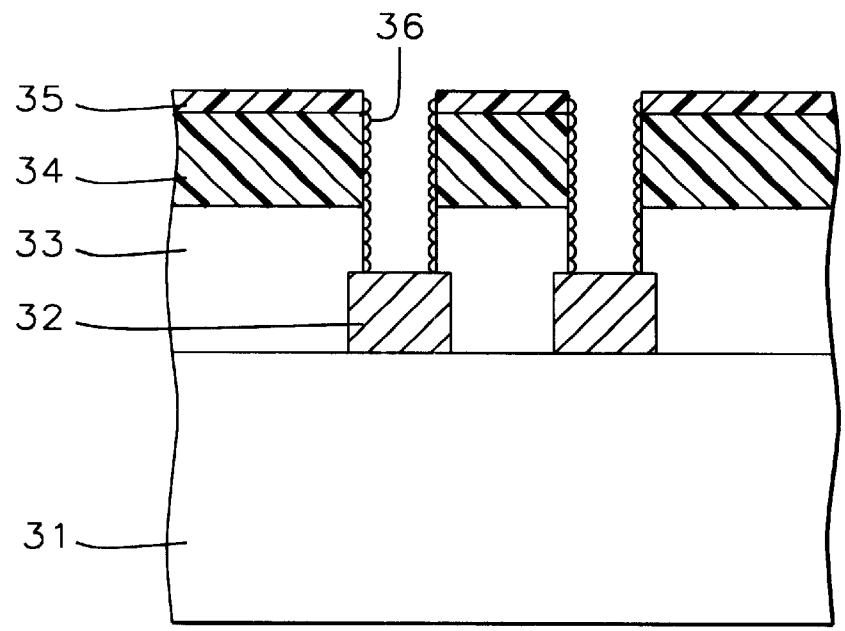
FIG. 3 is a cross section of a prior art substrate simply depicting a patterned conductor overlaid by a pattern insulator and a patterned photoresist illustrating the effect of RIE on the photo resist and the side wall of the via openings.
Figure 4A:
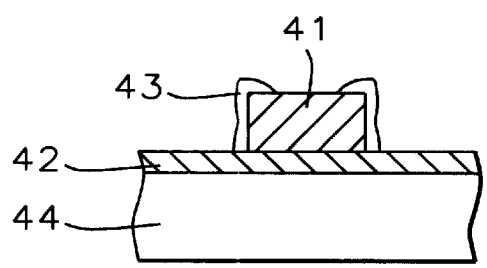
FIG. 4A is a cross sectional view of a polymer residue adhering to a patterned conductor overlying an insulator on a substrate.
Figure 4B:
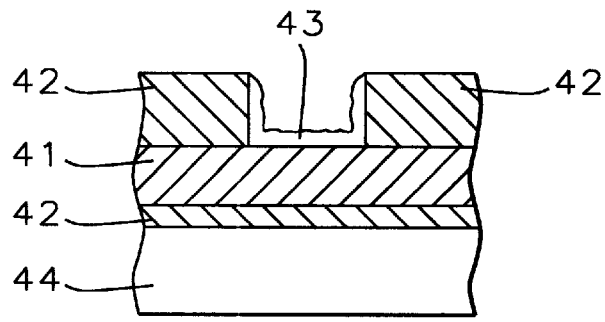
FIG. 4B is a cross-sectional sectional view of polymer residue adhering to the surfaces of a patterned conduction and the side wall of a via hole in a patterned insulator.
Figure 11:
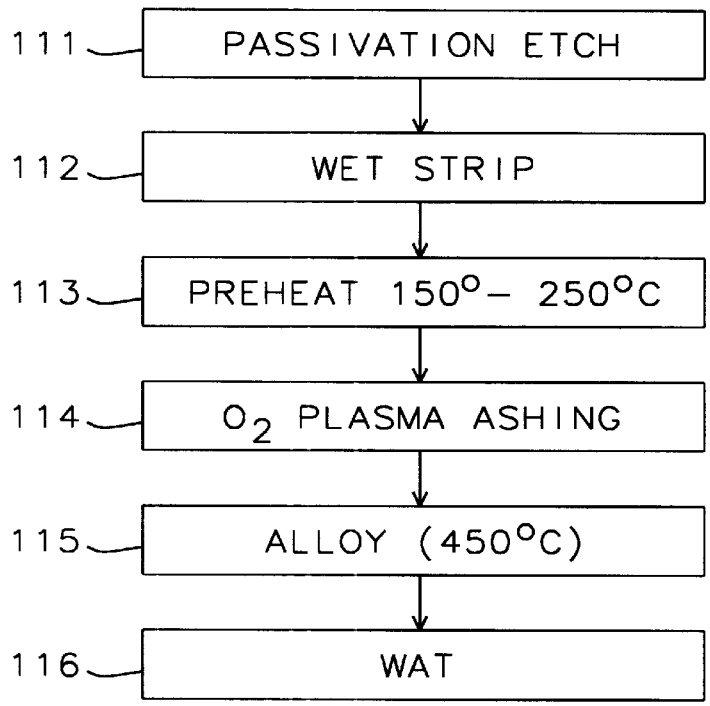
FIG. 11 is a flowchart of the method employed in the present invention to remove photoresist before the bond pad ally operation.

Refer to FIGS. 1, 2 and 11. The method of the first embodiment begins by providing a substrate fully populated with a plurality of semiconductor and electrical devices interconnected by several layers of interconnecting conductor material separated by patterned interconnection layers of insulator material, and capped with a final layer of blanket insulator material, namely the first passivation layer 3, underlying a layer of patterned photoresist 7.

Not shown in the flowchart of FIG. 11 is the step of applying a photoresist material to the substrate, the step of exposing the resist in a photolithographic operation to a patterned image or the step of developing the photoresist image.

The flowchart begins with the passivation etch step 111 necessary to open contact holes 4 in the passivation layer 3 using either a wet chemical or a dry etching treatment to expose the bond pads 2 to alloy processing. The preferred treatment is dry etching. A wet chemical stripping step 112, typically utilizing amino base chemicals, removes most of the patterned photoresist 8 from the surface of the substrate 1.

In a vacuum the substrate is then preheated in step 113 to a temperature in the range of 150 to 250 degrees Centigrade for 2 to 10 minutes for the purpose of extruding or moving the imbedded photoresist residue to the surface of the etched passivation layer for more effective exposure to the subsequent dry ash operation.

In the next step 114, a conventional oxygen plasma dry ash operation, the extruded photoresist residue together with other surface residue of the etching step 111 and the wet stripping step 112 are completely removed from the surface of the substrate 1.

An alloy step 115 is then performed by heating the substrate to 450 degrees Centigrade, typically in a vertical tube furnace, to cause alloying of the bond pads 2 to improve the bond pad 2 mechanical and electrical characteristics, specifically to reduce contact resistance between the integrated circuit wiring and chip carrier I/O, power supply and ground sources.

The final step in the method is the WAT (Wafer Acceptance Test) operation 116 which is employed for the purpose of testing the semiconductor device electrical properties.

Advantages of the Method

In addition to precluding an extruded photoresist defect during the bond pad alloy operation, this method eliminates the post alloy oxygen plasma dry ash step 105 found in the conventional method, FIG. 10, and results in a cost savings, a shorter manufacturing cycle time and the elimination of potential plasma damage or degradation to the devices on the substrate due to extra oxygen plasma dry ash operations.

Comparison to the Prior Art

Although the present invention and the prior art are both concerned with the complete removal of patterned photoresist after a major manufacturing step, the present invention can be distinguished from the prior art in several ways. First, the present invention deals with the manufacturing of the passivation (final) layers of the substrate while the prior art deals with semiconductor doping operations, multi-level patterned interconnection layers and with polyimide removal. Second, the present invention deals with an elevated heat treatment step that occurs before an oxygen plasma dry ash step while the prior art deals with low temperature treatment step during an oxygen plasma dry ash followed by a high temperature oxygen plasma dry ash or wet process as well as no heat treatment. Third, the present invention deals with a wet treatment step before the preheat treatment and dry ash steps, while the prior art deals with no wet treatment, or wet treatment after the dry ash step. Fourth, the present invention deals with a preheat treatment for the purpose of moving the photoresist, while the prior art heat treatment is to optimize the physics of dry ash removal of photoresist or anneal an insulation layer to improve insulation properties.

Second Embodiment

Figure 14:
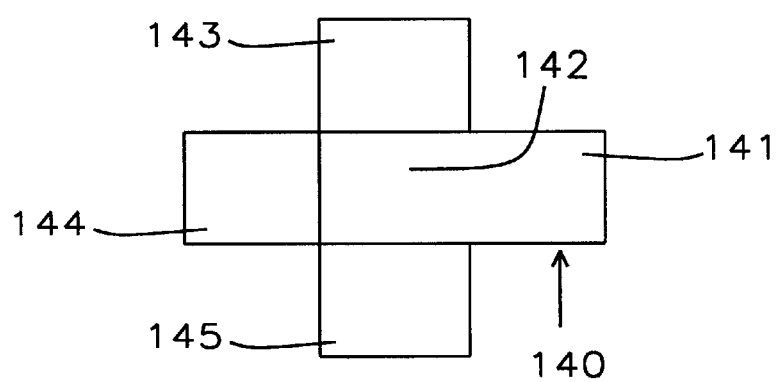
FIG. 14 is a top view of a schematic outlining a conventional IMMCVPS.

A load lock integrated modular multiple chamber vacuum processing system (IMMCVPS) illustrated in FIG. 14 is employed in the method of the present invention. The IMMCVPS 140 has a multiple of vacuum chambers 141, 143, 144 and 145 appended to a centrally located buffer chamber 142. The substrate together with other substrates are inserted into chamber 141 which contains a cassette for receiving and holding the substrates. Vacuum is drawn within the IMMCVPS 140 and individual substrates pass through the buffer chamber 142 by means of a transfer mechanism (not shown in the figure) to the other chambers. In one version, the IMMCVPS 140 contains two dry ash chambers 143 and 144 and a cooling chamber 145. The substrate is transferred to one of the dry ash chambers 143 or 144 for a heated dry ash operation 103. After the dry ash operation 103, the substrate is transferred to the cooling chamber 145 for the purpose of cooling the substrate prior to transferring the substrate back to the cassette in chamber 141. In the example, dry ash chambers 143 and 144 contain a substrate heating means, such as a hotplate or an infrared lamp.

In the second embodiment, the preheating means as required by the method of the first embodiment is described as follows. The dry ash chambers 143 and 144 each contain a means of heating a substrate and generating an oxygen plasma. In this configuration the heating is accomplished with a temperature controlled hotplate and oxygen plasma generation is accomplished by controlled radio frequency (RF) excitation. The substrate, stripped of the overlying patterned photoresist, is place in the dry ash chamber 143 or 144. During the preheat step 113 without RF oxygen plasma generation, the RF plasma generator is turned off and the substrate, in contact with the hotplate, is heated to a temperature in the range of 150 to 250 degrees Centigrade for 2 to 10 minutes to extrude the imbedded photoresist. Subsequently, the substrate is oxygen plasma dry ashed by engaging the RF plasma generator and adjusting the substrate temperature to between 150 to 250 degrees Centigrade to remove the extruded photoresist along with the other surface residues. Alternative means for the substrate preheating step while the oxygen plasma is turned off include infrared radiation from a switched infrared lamp as well as controlled microwave radiation of the substrate in contact with microwave absorptive material.

Third Embodiment

In a third embodiment, the configuration of the IMMCVPS 140 is modified to include a controlled heating means in the buffer chamber 142 for the purpose of improving the throughput by preheating a first substrate while a second substrate is occupying a dry ash chamber 143 or 144. The controlled preheating means in buffer chamber 142 is a hotplate of similar construction and control as the heating means located in the dry ash chamber 143 and 144. In the overall cycle the etched substrate stripped of the patterned photoresist is placed into buffer chamber 142 in contact with the hotplate and preheated in step 113 to a temperature in the range of 150 to 250 degrees C. to extrude the imbedded photoresist. The substrate is subsequently transferred to dry ash chamber 143 or 144 for the oxygen plasma operation 114.

Fourth Embodiment

In the fourth embodiment of the present invention the method is applied to the general removal of patterned photoresist from any of the semiconductor or interconnection layers of the substrate subject to an etching operation, in which the overlying patterned photoresist becomes imbedded in a recess or in a pinhole defect of the layer to be patterned.

Figure 12:
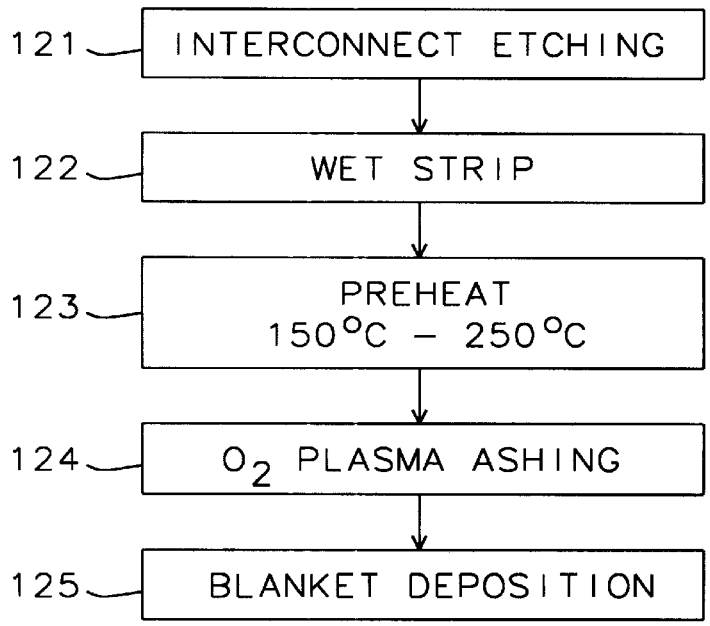
FIG. 12 is a flowchart of the method of the present invention as employed to remove photoresist from the substrate following etching of patterned conductors, semi-conductors and insulators.
Figure 13:
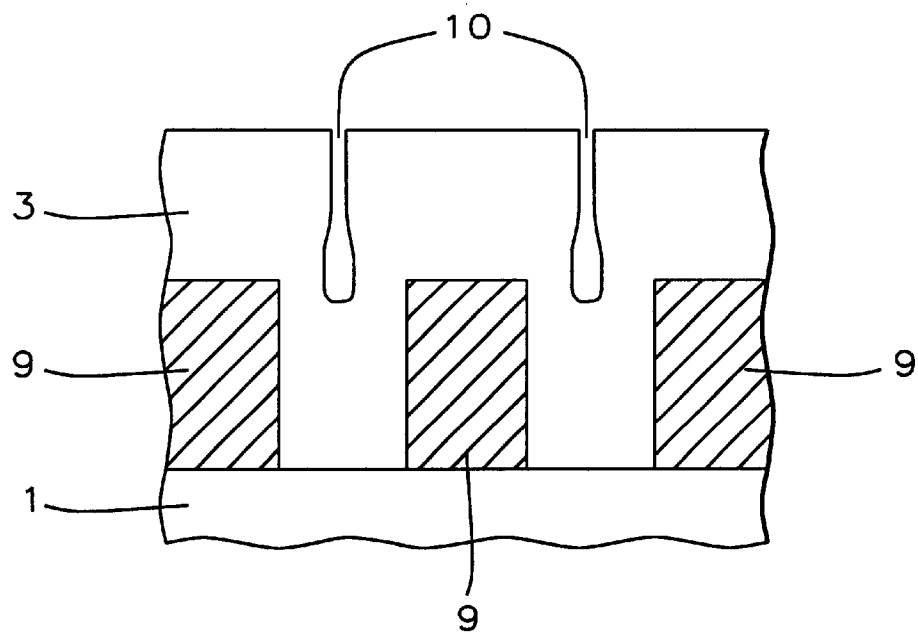
FIG. 13 is a proportional cross-sectional view of the relative size and shape of typical keyholes in the passivation layer.

FIG. 12 is a modification of the method found in FIG. 11 as step 121 refers to the general etching of any substrate layer and step 125 refers to the general process of providing a subsequent deposition of a blanket of semiconductor, conductor or insulator material for a subsequent patterning operation. The remaining steps 122, 123 and 124 are of similar purpose and operation to the steps 112, 113, and 114 respectively found in FIG. 11.

As well as accomplishing removal of patterned photoresist and residues from the substrate 1, it is also possible, by extruding the photoresist from pin hole defects, to find and observe the defect in an auxiliary inspection step (not shown in the figures) prior to the dry ash operation. Additionally, by removing the imbedded photoresist from the pinhole defect it is possible to assist in the ultimate rejection of the particular defective integrated circuit at a final testing operation.

While the invention has been particularly shown and described with reference to the preferred embodiments thereof, it will be understood by those skilled in the art that various changes in form and details may be made without departing from the spirit and scope of the invention.

What is claimed is:

1. A method for removing from a substrate made of semiconductor material a photoresist layer coated on an underlying layer of material comprising the steps of:

stripping the photoresist later from the substrate by a wet chemical treatment;

heat treating the substrate in a vacuum chamber for a period of time in the range 2 to 10 minutes to a temperature in the range of 150 to 250 degrees Centigrade to release a photoresist residue imbedded within the underlying layer of material;

dry ashing the heat treated substrate with a oxygen plasma whereby the released photoresist residue is removed from the substrate.

2. A method as recited in claim 1 wherein the underlying layer of material is an insulator.

3. A method as recited in claim 1 wherein the underlying layer of material is a conductor.

4. A method for removing from a substrate made of semiconductor material a patterned photoresist layer overlying a patterned layer of material formed by an etching process comprising the steps of:

stripping the patterned photoresist layer from the substrate by a wet chemical treatment;

heat treating the substrate in a vacuum chamber for a period of time in the range between 2 to 10 minutes to a temperature elevated in the range of 150 to 250 degrees Centigrade to release a photoresist residue imbedded within the etched layer of material:

dry ashing the heat treated substance with an oxygen plasma whereby the released photoresist residue together with residues from the etching process and the wet chemical treatment are removed from the substrate.

5. A method as recited in claim 4 wherein the patterned layer of material is a patterned conductor layer.

6. A method as recited in claim 4 wherein the patterned layer of material is a patterned insulator layer.

7. A method as recited in claim 6 wherein the patterned insulator layer is the passivation layer.

8. A method for removing from a substrate made of semiconductor material a patterned photoresist layer overlying a passivation layer deposited over an array of bond pads comprising the steps of:

etching the passivation layer to form an array of contact openings to the array of bond pads;

stripping the patterned photoresist layer from the substrate by a wet chemical treatment;

heat treating the substrate in a vacuum chamber for a period of time in the range between 2 to 10 minutes to a temperature elevated in the range of 150 to 250 degrees Centigrade to release a photoresist residue imbedded within the passivation layer;

dry ashing the heat treated substrate with an oxygen plasma whereby the released photoresist residue together with residues from the etching process and the wet chemical treatment are removed from the substrate.

9. A method of preparation for alloying an array of bond pads on a substrate made of semiconductor material overlaid with a passivation layer underlying a patterned photoresist layer comprising the steps of:

etching the passivation layer to form an array of contact openings to the array of bond pads;

stripping the patterned photoresist layer from the substrate by a wet chemical treatment;

heat treating the substrate in a vacuum chamber to a temperature in the range of 150 to 250 degrees Centigrade for a time in the range between 2 to 10 minutes to release a photoresist residue imbedded within the etched passivation layer;

dry ashing the heat treated substrate with an oxygen plasma whereby the release photoresist residue together with residues from the etching process and the wet chemical treatment are removed from the substrate.

* * * * *